(12) United States Patent
Peake et al.

(10) Patent No.: US 11,606,431 B2
(45) Date of Patent: Mar. 14, 2023

(54) MAINTAINING FAILURE INDEPENDENCE FOR STORAGE OF A SET OF ENCODED DATA SLICES

(71) Applicant: Pure Storage, Inc., Mountain View, CA (US)

(72) Inventors: Andrew G. Peake, Chicago, IL (US); Jason K. Resch, Warwick, RI (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 17/651,614

(22) Filed: Feb. 18, 2022

(65) Prior Publication Data

US 2022/0174114 A1 Jun. 2, 2022

Related U.S. Application Data

(63) Continuation-in-part of application No. 16/862,166, filed on Apr. 29, 2020, now Pat. No. 11,283,871,
(Continued)

(51) Int. Cl.
*G06F 15/167* (2006.01)
*H04L 67/1097* (2022.01)
(Continued)

(52) U.S. Cl.
CPC ........ *H04L 67/1097* (2013.01); *G06F 16/182* (2019.01); *H04L 67/5682* (2022.05); *H04L 67/60* (2022.05); *H04L 67/62* (2022.05)

(58) Field of Classification Search
None
See application file for complete search history.

(56) References Cited

U.S. PATENT DOCUMENTS

| 4,092,732 A | 5/1978 | Ouchi |
| 5,454,101 A | 9/1995 | Mackay |
(Continued)

OTHER PUBLICATIONS

Chung; An Automatic Data Segmentation Method for 3D Measured Data Points; National Taiwan University; pp. 1-8; 1998.
(Continued)

*Primary Examiner* — Phuoc H Nguyen
(74) *Attorney, Agent, or Firm* — Garlick & Markison; Timothy W. Markison; Timothy D. Taylor

(57) ABSTRACT

A method includes detecting a storage error associated with a first memory device of a storage unit of a set of storage units, where data is error encoded into a set of encoded data slices and stored in a plurality of memory devices of the set of storage units, and where the plurality of memory devices includes the first memory device. The method further includes determining attributes associated with the first memory device and determining attributes of other memory devices of the plurality of memory devices. The method further includes selecting a memory device from the other memory devices based on the attributes of the memory device comparing favorably to the attributes associated with the first memory device. The method further includes rebuilding an encoded data slice associated with the storage error and storing the rebuilt encoded data slice in the selected memory device.

20 Claims, 10 Drawing Sheets

Related U.S. Application Data which is a continuation of application No. 16/256,649, filed on Jan. 24, 2019, now Pat. No. 10,673,946, which is a continuation-in-part of application No. 15/805,085, filed on Nov. 6, 2017, now Pat. No. 10,205,783, which is a continuation of application No. 14/721,723, filed on May 26, 2015, now Pat. No. 9,838,478, which is a continuation-in-part of application No. 14/707,943, filed on May 8, 2015, now Pat. No. 9,923,838.

(60) Provisional application No. 62/031,320, filed on Jul. 31, 2014, provisional application No. 62/019,074, filed on Jun. 30, 2014.

(51) Int. Cl.
*G06F 16/182* (2019.01)
*H04L 67/60* (2022.01)
*H04L 67/62* (2022.01)
*H04L 67/5682* (2022.01)

(56) References Cited

U.S. PATENT DOCUMENTS

| | | | |
|---|---|---|---|
| 5,485,474 A | 1/1996 | Rabin | |
| 5,774,643 A | 6/1998 | Lubbers | |
| 5,802,364 A | 9/1998 | Senator | |
| 5,809,285 A | 9/1998 | Hilland | |
| 5,890,156 A | 3/1999 | Rekieta | |
| 5,987,622 A | 11/1999 | Lo Verso | |
| 5,991,414 A | 11/1999 | Garay | |
| 6,012,159 A | 1/2000 | Fischer | |
| 6,058,454 A | 5/2000 | Gerlach | |
| 6,128,277 A | 10/2000 | Bruck | |
| 6,175,571 B1 | 1/2001 | Haddock | |
| 6,192,472 B1 | 2/2001 | Garay | |
| 6,256,688 B1 | 7/2001 | Suetaka | |
| 6,272,658 B1 | 8/2001 | Steele | |
| 6,301,604 B1 | 10/2001 | Nojima | |
| 6,356,949 B1 | 3/2002 | Katsandres | |
| 6,366,995 B1 | 4/2002 | Vilkov | |
| 6,374,336 B1 | 4/2002 | Peters | |
| 6,415,373 B1 | 7/2002 | Peters | |
| 6,418,539 B1 | 7/2002 | Walker | |
| 6,449,688 B1 | 9/2002 | Peters | |
| 6,567,948 B2 | 5/2003 | Steele | |
| 6,571,282 B1 | 5/2003 | Bowman-Amuah | |
| 6,609,223 B1 | 8/2003 | Wolfgang | |
| 6,651,070 B1 | 11/2003 | Hirashima | |
| 6,718,361 B1* | 4/2004 | Basani | H04L 67/1095 709/201 |
| 6,760,808 B2 | 7/2004 | Peters | |
| 6,785,768 B2 | 8/2004 | Peters | |
| 6,785,783 B2 | 8/2004 | Buckland | |
| 6,826,711 B2* | 11/2004 | Moulton | G06F 11/1076 714/E11.034 |
| 6,879,596 B1 | 4/2005 | Dooply | |
| 7,003,688 B1* | 2/2006 | Pittelkow | G06F 11/2089 714/4.2 |
| 7,024,451 B2 | 4/2006 | Jorgenson | |
| 7,024,609 B2 | 4/2006 | Wolfgang | |
| 7,080,101 B1 | 7/2006 | Watson | |
| 7,103,824 B2 | 9/2006 | Halford | |
| 7,103,915 B2 | 9/2006 | Redlich | |
| 7,111,115 B2 | 9/2006 | Peters | |
| 7,140,044 B2 | 11/2006 | Redlich | |
| 7,146,644 B2 | 12/2006 | Redlich | |
| 7,171,493 B2 | 1/2007 | Shu | |
| 7,222,133 B1 | 5/2007 | Raipurkar | |
| 7,240,236 B2 | 7/2007 | Cutts | |
| 7,272,613 B2 | 9/2007 | Sim | |
| 7,636,724 B2 | 12/2009 | De La Torre | |
| 8,275,744 B2 | 9/2012 | Baptist | |
| 2002/0062422 A1 | 5/2002 | Butterworth | |
| 2002/0166079 A1 | 11/2002 | Ulrich | |
| 2003/0018927 A1 | 1/2003 | Gadir | |
| 2003/0037261 A1 | 2/2003 | Meffert | |
| 2003/0065617 A1 | 4/2003 | Watkins | |
| 2003/0084020 A1 | 5/2003 | Shu | |
| 2004/0024963 A1 | 2/2004 | Talagala | |
| 2004/0030771 A1 | 2/2004 | Strassner | |
| 2004/0122917 A1 | 6/2004 | Menon | |
| 2004/0215998 A1 | 10/2004 | Buxton | |
| 2004/0228493 A1 | 11/2004 | Ma | |
| 2005/0100022 A1 | 5/2005 | Ramprashad | |
| 2005/0102297 A1 | 5/2005 | Lloyd | |
| 2005/0114594 A1 | 5/2005 | Corbett | |
| 2005/0125593 A1 | 6/2005 | Karpoff | |
| 2005/0131993 A1 | 6/2005 | Fatula, Jr. | |
| 2005/0132070 A1 | 6/2005 | Redlich | |
| 2005/0144382 A1 | 6/2005 | Schmisseur | |
| 2005/0229069 A1 | 10/2005 | Hassner | |
| 2006/0047907 A1 | 3/2006 | Shiga | |
| 2006/0136448 A1 | 6/2006 | Cialini | |
| 2006/0156059 A1 | 7/2006 | Kitamura | |
| 2006/0224603 A1 | 10/2006 | Correll, Jr. | |
| 2007/0079081 A1 | 4/2007 | Gladwin | |
| 2007/0079082 A1 | 4/2007 | Gladwin | |
| 2007/0079083 A1 | 4/2007 | Gladwin | |
| 2007/0088970 A1 | 4/2007 | Buxton | |
| 2007/0174192 A1 | 7/2007 | Gladwin | |
| 2007/0214285 A1 | 9/2007 | Au | |
| 2007/0234110 A1 | 10/2007 | Soran | |
| 2007/0283167 A1 | 12/2007 | Venters, III | |
| 2009/0094251 A1 | 4/2009 | Gladwin | |
| 2009/0094318 A1 | 4/2009 | Gladwin | |
| 2010/0023524 A1 | 1/2010 | Gladwin | |
| 2011/0106972 A1 | 5/2011 | Grube et al. | |
| 2011/0185258 A1 | 7/2011 | Grube et al. | |
| 2012/0089809 A1 | 4/2012 | Resch | |
| 2012/0311068 A1 | 12/2012 | Gladwin et al. | |
| 2013/0110962 A1 | 5/2013 | Grube | |
| 2013/0111166 A1 | 5/2013 | Resch | |
| 2013/0151670 A1 | 6/2013 | Leggette | |
| 2013/0275480 A1 | 10/2013 | Dhuse | |
| 2013/0290482 A1 | 10/2013 | Leggette | |
| 2013/0290703 A1 | 10/2013 | Resch | |
| 2013/0322418 A1 | 12/2013 | Ho | |
| 2014/0115579 A1 | 4/2014 | Kong | |
| 2014/0164551 A1 | 6/2014 | Resch | |
| 2014/0195875 A1 | 7/2014 | Resch | |
| 2014/0245063 A1 | 8/2014 | Baptist | |
| 2014/0330921 A1 | 11/2014 | Storm | |
| 2015/0067421 A1 | 3/2015 | Baptist | |
| 2016/0179618 A1 | 6/2016 | Resch | |
| 2016/0378350 A1 | 12/2016 | Motwani | |
| 2017/0168720 A1 | 6/2017 | Kazi | |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

(56) References Cited

OTHER PUBLICATIONS

Sermersheim; Lightweight Directory Access Protocol (LDAP): The Protocol; IETF Network Working Group; RFC 4511; Jun. 2006; pp. 1-68.
Shamir; How to Share a Secret; Communications of the ACM; vol. 22, No. 11; Nov. 1979; pp. 612-613.
Smith; Lightweight Directory Access Protocol (LDAP): Uniform Resource Locator; IETF Network Working Group; RFC 4516; Jun. 2006; pp. 1-15.
Smith; Lightweight Directory Access Protocol (LDAP): String Representation of Search Filters; IETF Network Working Group; RFC 4515; Jun. 2006; pp. 1-12.
Wildi; Java iSCSi Initiator; Master Thesis; Department of Computer and Information Science, University of Konstanz; Feb. 2007; 60 pgs.
Xin, et al.; Evaluation of Distributed Recovery in Large-Scale Storage Systems; 13th IEEE International Symposium on High Performance Distributed Computing; Jun. 2004; pp. 172-181.
Zeilenga; Lightweight Directory Access Protocol (LDAP): Directory Information Models; IETF Network Working Group; RFC 4512; Jun. 2006; pp. 1-49.
Zeilenga; Lightweight Directory Access Protocol (LDAP): Internationalized String Preparation; IETF Network Working Group; RFC 4518; Jun. 2006; pp. 1-14.
Zeilenga; Lightweight Directory Access Protocol (LDAP): String Representation of Distinguished Names; IETF Network Working Group; RFC 4514; Jun. 2006; pp. 1-15.
Zeilenga; Lightweight Directory Access Protocol (LDAP): Technical Specification Road Map; IETF Network Working Group; RFC 4510; Jun. 2006; pp. 1-8.

\* cited by examiner

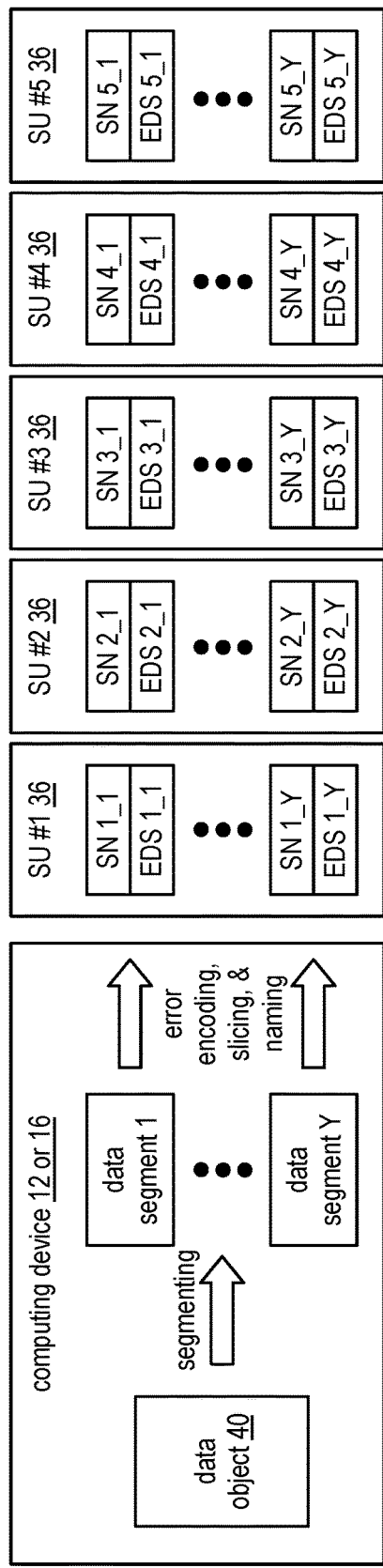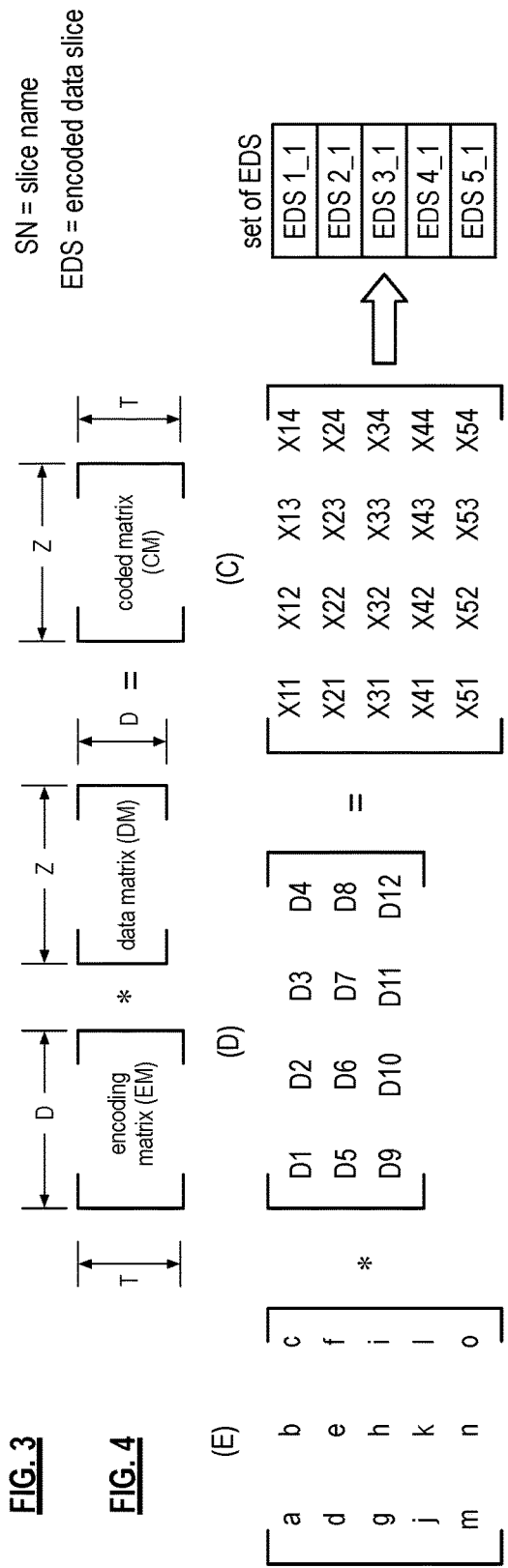

| memory device characteristics 110 | | | |
|---|---|---|---|
| memory ID 111 | capacity | speed | reliability |
| memory device 1 | 2 TB | 100 MHz | 34 |
| memory device 2 | 1 GB | 3 GHz | 92 |
| ••• | ••• | ••• | ••• |
| memory device n | 16 GB | 1 GHz | 71 |

FIG. 11A

| storage unit characteristics 112 | | | |
|---|---|---|---|
| SU ID 113 | capacity | total IOPS | reliability |
| storage unit 1 | 1000 TB | 1750 | 64 |
| storage unit 2 | 50 TB | 950000 | 88 |
| ••• | ••• | ••• | ••• |
| storage unit n | 300 TB | 80000 | 94 |

FIG. 11B

| storage pool characteristics 114 | | | |
|---|---|---|---|
| SP ID 115 | capacity | avg latency | reliability |
| storage pool 1 | 1000 PB | 20 ms | 88 |
| storage pool 2 | 505 ZB | 2 s | 65 |
| ••• | ••• | ••• | ••• |
| storage pool n | 107 EB | 50ps | 87 |

FIG. 11C

MAINTAINING FAILURE INDEPENDENCE FOR STORAGE OF A SET OF ENCODED DATA SLICES

CROSS-REFERENCE TO RELATED APPLICATIONS

The present U.S. Utility Patent Application claims priority pursuant to 35 U.S.C. § 120 as a continuation-in-part of U.S. Utility application Ser. No. 16/862,166, entitled "PROCESSING DATA ACCESS REQUESTS FOR DIFFERENT TYPES OF DATA USING A DECENTRALIZED AGREEMENT PROTOCOL", filed Apr. 29, 2020, which is a continuation of U.S. Utility application Ser. No. 16/256,649, entitled "USING SEPARATE WEIGHTING SCORES FOR DIFFERENT TYPES OF DATA IN A DECENTRALIZED AGREEMENT PROTOCOL", filed Jan. 24, 2019, issued as U.S. Pat. No. 10,673,946 on Jun. 2, 2020, which is a continuation-in-part of U.S. Utility application Ser. No. 15/805,085, entitled "IDENTIFYING A TASK EXECUTION RESOURCE OF A DISPERSED STORAGE NETWORK", filed Nov. 6, 2017, issued as U.S. Pat. No. 10,205,783 on Feb. 12, 2019, which is a continuation of U.S. Utility application Ser. No. 14/721,723, entitled "IDENTIFYING A TASK EXECUTION RESOURCE OF A DISPERSED STORAGE NETWORK", filed May 26, 2015, issued on Dec. 5, 2017 as U.S. Pat. No. 9,838,478, which claims priority pursuant to 35 U.S.C. § 119(e) to U.S. Provisional Application No. 62/031,320, entitled "REBUILDING DATA IN A DISPERSED STORAGE NETWORK", filed Jul. 31, 2014, expired, all of which are hereby incorporated herein by reference in their entirety and made part of the present U.S. Utility Patent Application for all purposes.

U.S. Utility Patent Application Ser. No. 14/721,723 also claims priority pursuant to 35 U.S.C. § 120 as a continuation-in-part of U.S. Utility application Ser. No. 14/707,943, entitled "ACCESSING A DISPERSED STORAGE NETWORK", filed May 8, 2015, issued as U.S. Pat. No. 9,923,838 on Mar. 20, 2018, which claims priority pursuant to 35 U.S.C. § 119(e) to U.S. Provisional Application No. 62/019,074, entitled "UTILIZING A DECENTRALIZED AGREEMENT PROTOCOL IN A DISPERSED STORAGE NETWORK", filed Jun. 30, 2014, expired, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to data access of a DSN memory.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

Figure 12:
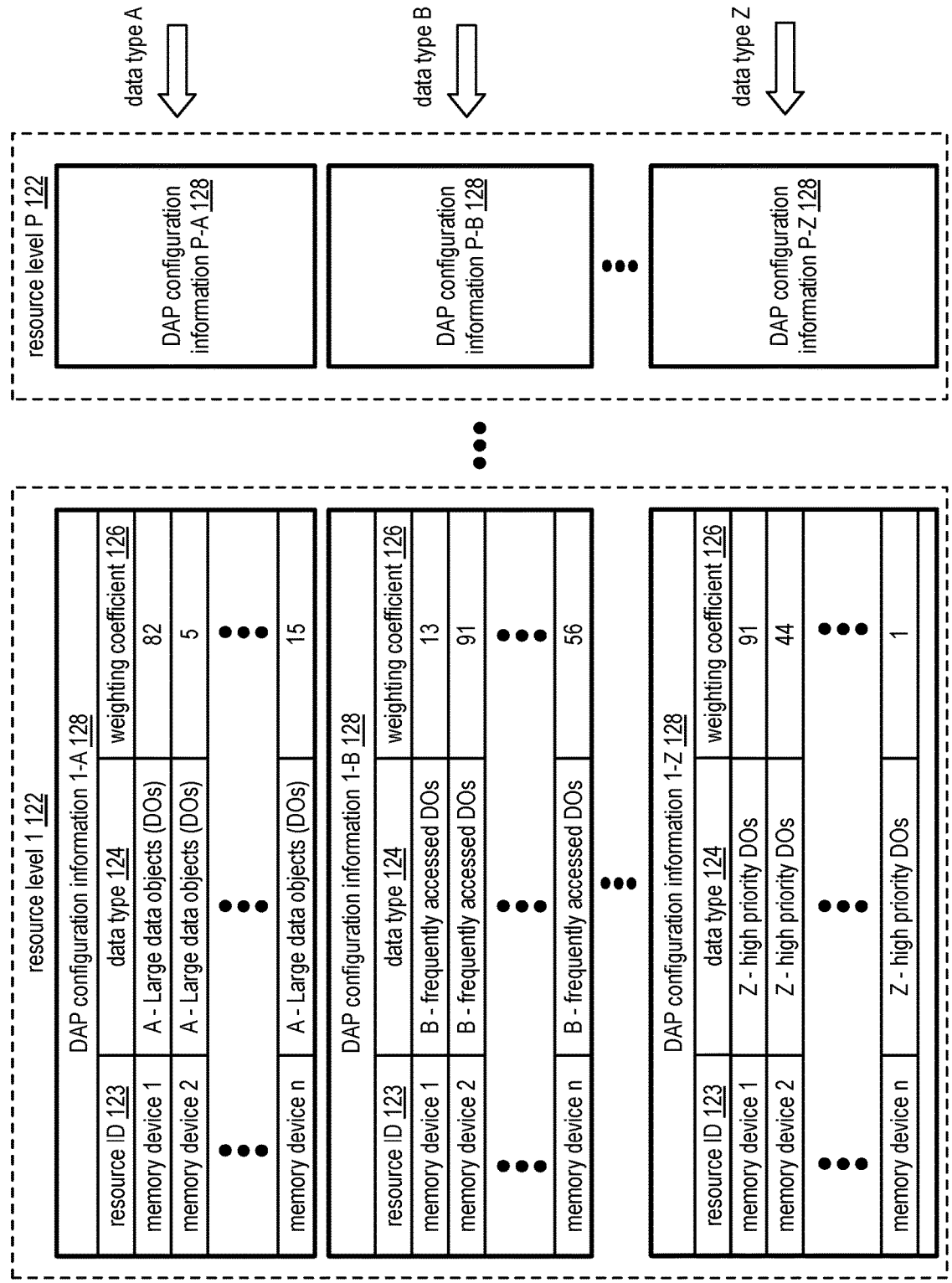
Figure 13:
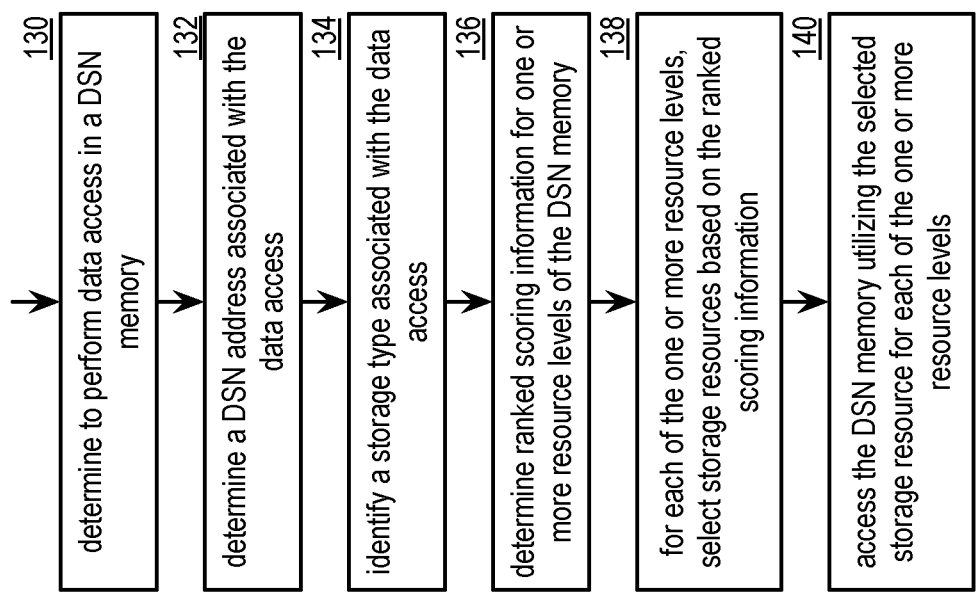
Figure 14:
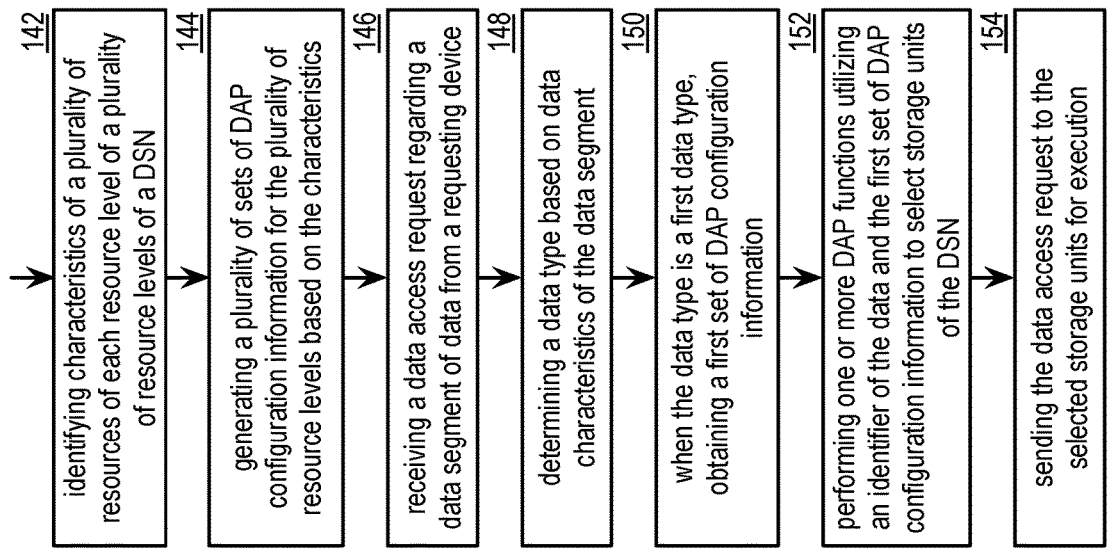

FIGS. 11A-C are schematic block diagrams of an embodiment of examples of resource characteristics;

FIG. 12 is a schematic block diagram of an embodiment of a plurality of sets of distributed agreement protocol (DAP) configuration information;

FIG. 13 is a flowchart illustrating an embodiment of an example of selecting storage resources; and FIG. 14 is a flowchart illustrating an embodiment of an example of a method of generating DAP configuration information to utilize in selecting storage units of a dispersed storage network (DSN).

DETAILED DESCRIPTION OF THE INVENTION

Figure 1:
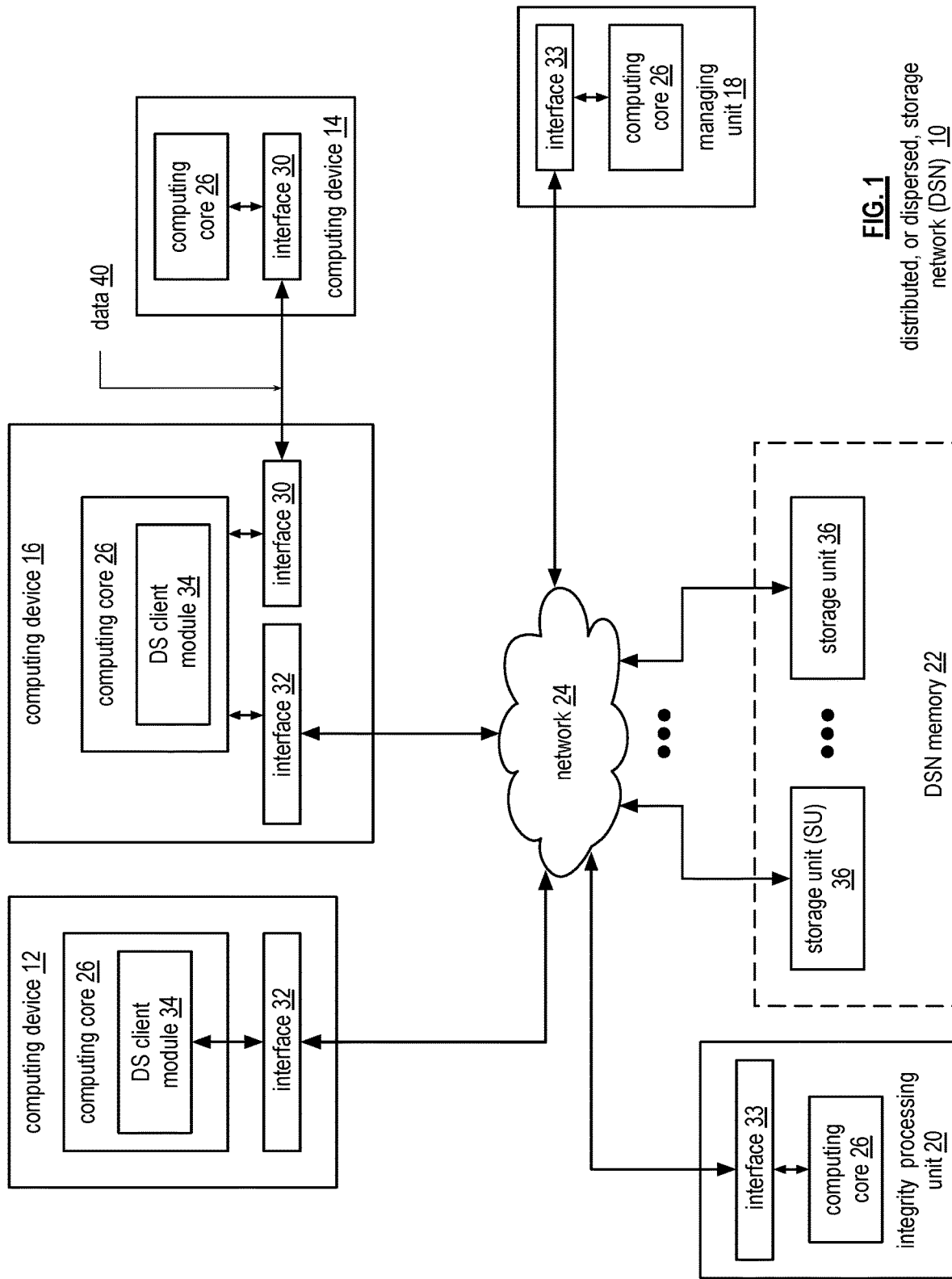
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
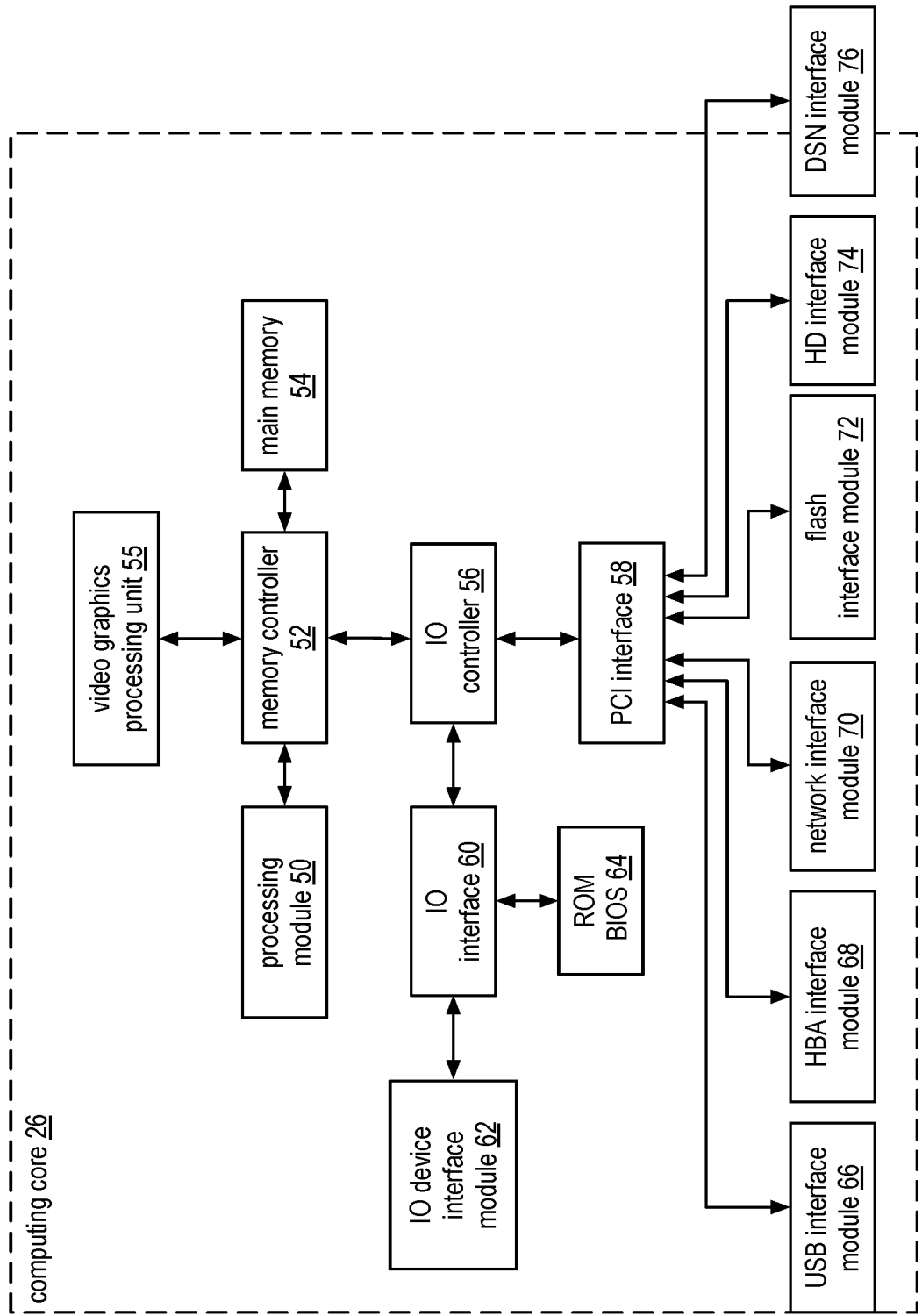
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data 40 on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN (distributed storage and task network) memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate per-access billing information. In another instance, the DSTN managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 78 is shown in FIG. 6. As shown, the slice name (SN) 78 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
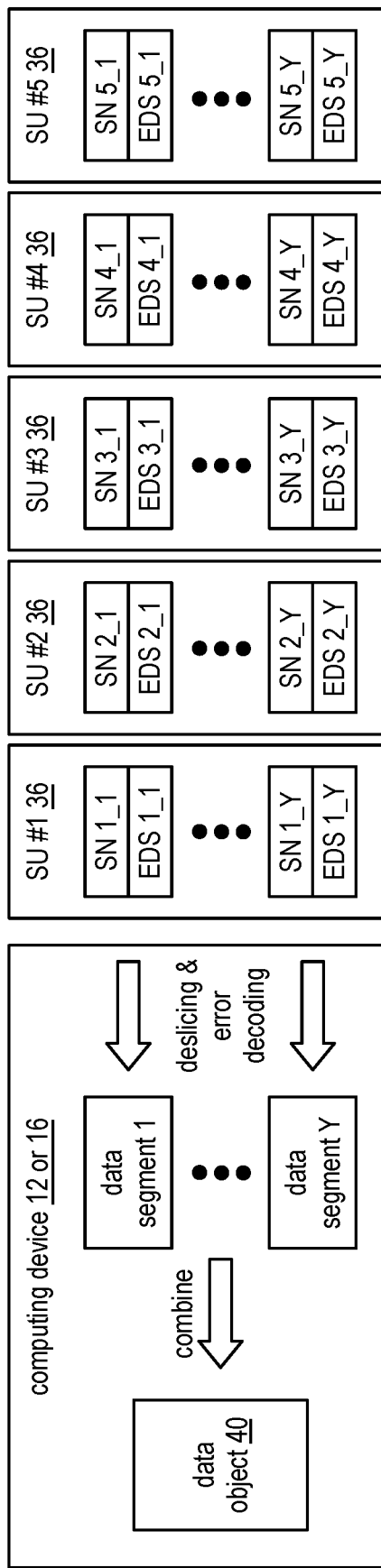
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
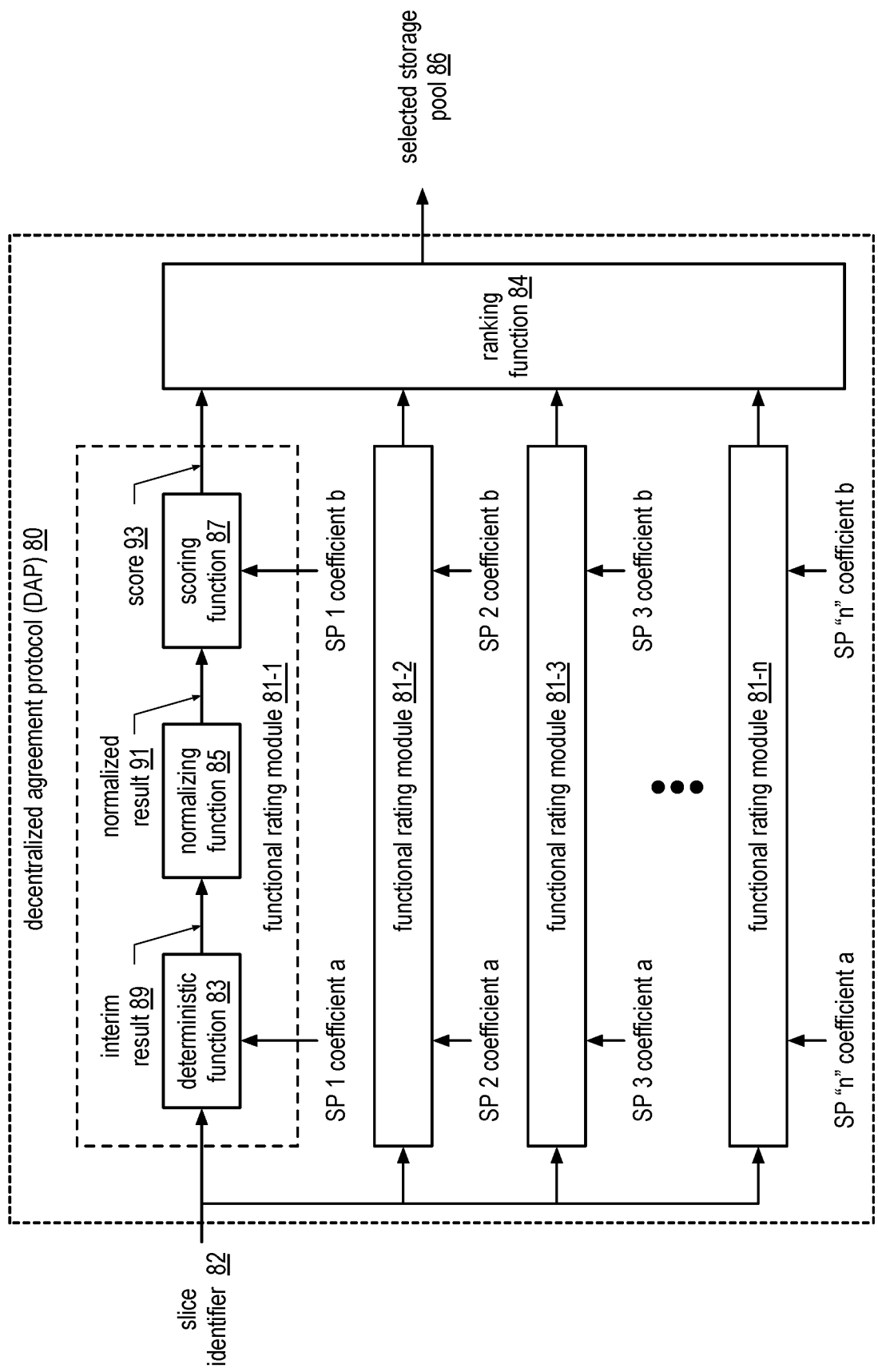
FIG. 9 is a schematic block diagram of an embodiment of a decentralized, or distributed, agreement protocol (DAP)

FIG. 9 is a schematic block diagram of an embodiment of a decentralized, or distributed, agreement protocol (DAP) 80 that may be implemented by a computing device, a storage unit, and/or any other device or unit of the DSN to determine where to store encoded data slices or where to find stored encoded data slices. The DAP 80 includes a plurality of functional rating modules 81-1 through 81-n. Each of the functional rating modules 81 includes a deterministic function 83, a normalizing function 85, and a scoring function 87.

Each functional rating module 81 receives, as inputs, a slice identifier 82 and storage pool (SP) coefficients (e.g., a first functional rating module 81-1 receives SP 1 coefficients "a" and b). Based on the inputs, where the SP coefficients are different for each functional rating module 81, each functional rating module 81 generates a unique score 93 (e.g., an alpha-numerical value, a numerical value, etc.). The ranking function 84 receives the unique scores 93 and orders them based on an ordering function (e.g., highest to lowest, lowest to highest, alphabetical, etc.) and then selects one as a selected storage pool 86. Note that a storage pool includes one or more sets of storage units. Further note that the slice identifier 82 corresponds to a slice name or common attributes of set of slices names. For example, for a set of encoded data slices, the slice identifier 82 specifies a data segment number, a vault ID, and a data object ID, but leaves open ended, the pillar number. As another example, the slice identifier 82 specifies a range of slice names (e.g., 0000 0000 to FFFF FFFF).

As a specific example, the first functional rating module 81-1 receives the slice identifier 82 and SP coefficients for storage pool 1 of the DSN. The SP coefficients includes a first coefficient (e.g., "a") and a second coefficient (e.g., "b"). For example, the first coefficient is a unique identifier for the corresponding storage pool (e.g., SP #1's ID for SP 1 coefficient "a") and the second coefficient is a weighting factor for the storage pool. In one example, the weighting factors are determined based on the types of memory within a storage pool, vault, set of storage units, and/or a storage unit. This is discussed in greater detail with reference to FIGS. 10-11.

In another example, the weighting factors are derived to ensure, over time, data is stored in the storage pools in a fair and distributed manner based on the capabilities of the storage units within the storage pools. For example, the weighting factor includes an arbitrary bias which adjusts a proportion of selections to an associated location such that a probability that a source name will be mapped to that location is equal to the location weight divided by a sum of all location weights for all locations of comparison (e.g., locations correspond to storage units). As a specific example, each storage pool is associated with a location weight factor based on storage capacity such that, storage pools with more storage capacity have a higher location weighting factor than storage pools with less storage capacity.

The deterministic function 83, which may be a hashing function, a hash-based message authentication code function, a mask generating function, a cyclic redundancy code function, hashing module of a number of locations, consistent hashing, rendezvous hashing, and/or a sponge function, performs a deterministic function on a combination and/or concatenation (e.g., add, append, interleave) of the slice identifier 82 and the first SP coefficient (e.g., SU 1 coefficient "a") to produce an interim result 89.

The normalizing function 85 normalizes the interim result 89 to produce a normalized interim result 91. For instance, the normalizing function 85 divides the interim result 89 by a number of possible output permutations of the deterministic function 83 to produce the normalized interim result. For example, if the interim result is 4,325 (decimal) and the number of possible output permutations is 10,000, then the normalized result is 0.4325.

The scoring function 87 performs a mathematical function on the normalized result 91 to produce the score 93. The mathematical function may be division, multiplication, addition, subtraction, a combination thereof, and/or any mathematical operation. For example, the scoring function divides the second SP coefficient (e.g., SP 1 coefficient "b") by the negative log of the normalized result (e.g., $e^y=x$ and/or $\ln(x)=y$). For example, if the second SP coefficient is 17.5 and the negative log of the normalized result is 1.5411 (e.g., $e^{(0.4235)}$), the score is 11.3555.

The ranking function 84 receives the scores 93 from each of the function rating modules 81 and orders them to produce a ranking of the storage pools. For example, if the ordering is highest to lowest and there are five storage units in the DSN, the ranking function evaluates the scores for five storage units to place them in a ranked order. From the ranking, the ranking module 84 selects one of the storage pools 86, which is the target for a set of encoded data slices.

In some embodiments, the DAP 80 is further used to identify a set of storage units, an individual storage unit, and/or a memory device within the storage unit. To achieve different output results, the coefficients are changed according to the desired location information. The DAP 80 may also output the ranked ordering of the scores.

Figure 10:
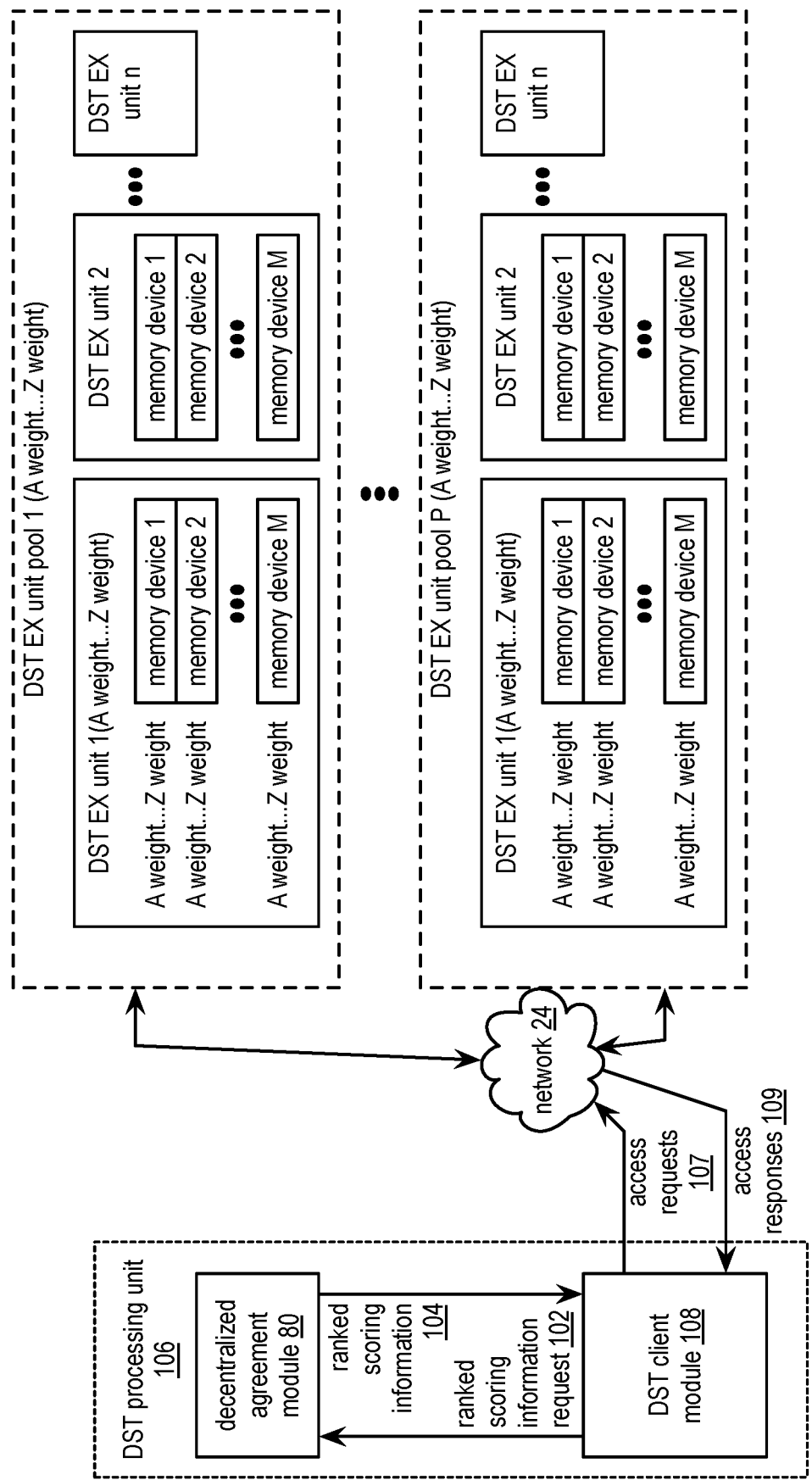
FIG. 10 is a schematic block diagram of another embodiment of a dispersed storage network (DSN)

FIG. 10 is a schematic block diagram of another embodiment of a dispersed storage network (DSN) that includes the distributed storage and task (DST) processing unit 106, the network 24 of FIG. 1, and a plurality of DST execution (EX) unit pools 1-P. The DST processing unit 106 includes the decentralized agreement module 80 of FIG. 9 and a DST client module. In one example, the DST processing unit 106 is implemented by the DS processing unit 16 of FIG. 1. In one example, the DST client module 108 is implemented by DS client module 34 of FIG. 1. Each DST execution unit pool includes a set of DST execution units 1-n. Each DST execution unit 1-n may be implemented utilizing the storage unit 36 of FIG. 1. Each DST execution unit includes a plurality of memory devices 1-M.

The DSN functions to receive data access requests 107, select resources of at least one DST execution unit pool 1-P for data access, utilize the selected DST execution unit pool for the data access, and issue a data access response 109 based on the data access. The selecting of the resources includes utilizing a decentralized agreement function of the decentralized agreement module 80, where a plurality of storage resource locations are ranked against each other. The selecting may include selecting one storage pool of the plurality of storage pools, selecting DST execution units at various sites of a plurality of sites, selecting a memory of the plurality of memories for each DST execution unit, and selecting combinations of memories, DST execution units, sites, pillars, and storage pools.

In an embodiment the DSN stores many different types of data. Each of the types of data can impose or stress different limits of the DST EX unit (e.g., a storage unit). In an example, main cost to the DSN for very small data (i.e., index data or meta-data objects) is in terms of IOPS (input/output operations per second) imposed on the underlying storage, as the very small data uses very little storage capacity. Thus, when a decentralized agreement protocol (DAP) is used, (e.g., which biases based on weights) different system configurations (e.g., with different weights) may be evaluated for different storage types (e.g., bulk large objects vs. small and/or frequently accessed data).

In an example, for bulk data storage, it generally makes the most sense to bias (e.g., the weights) based on capacity, so that the system reaches equal levels of fullness at the same time. For the small data, which uses almost no storage, it is far less important to bias storage locations by storage capacity. Different DST EX units may be differently optimized for capacity and performance. As an example, a DS unit use ultra-fast but low capacity high revolutions per minute (RPM) drives and thus a low bias (e.g., a small weight (e.g., below a weight threshold, proportional to comparing its capacity to the system capacity, etc.)) for storage capacity, but a high bias (e.g., large weight, (e.g., greater than a second weight threshold, where the second weight threshold is greater than the first weight threshold)) for IOPS.

In this example, the DST processing unit 106 uses (e.g., generates, obtains) a system configuration (e.g., a set of DAP configuration information) for each storage type defined in the system. Each system configuration contains a biasing weight for each storage location in the system, and these weights may be different between the two configurations even for the same DST EX unit. Then, depending on the type of data being stored, the system configuration for the storage type to which that data belongs indicates a DAP function to utilize, along with unique identifiers of the resources of a resource level and their respective weighting coefficients, which determines the storage location for the data. Note that the system configuration (e.g., DAP configuration information) is updated for a variety of reasons. As a first reason, the DST processing unit 106 receives a command to update the system configuration. As another example, changes to memory of the DSN causes an update to the system configurations. For example, when high-performance but low capacity storage is added, that new storage will get a larger fraction of small frequently accessed objects, and a much smaller fraction of bulk data. Based on the updated system configurations, data is then redistributed in accordance with the updated DAP.

In an example of operation, the DST client module 108 determines to perform a data access request 107. For example, the DST client module 108 receives a data access request 107 that includes at least one of a store data request, a retrieve data request, a delete data request, a data name, and a requesting entity identifier (ID). Having determined to perform the data access request, the DST client module 108 determines a DSN address associated with the data access request. The DSN address includes at least one of a source name (e.g., including a vault ID and an object number associated with the data name), a data segment ID, a set of slice names, a plurality of sets of slice names. The determining includes at least one of generating (e.g., for the store data request) and retrieving (e.g., from a DSN directory) based on the data name (e.g., for the retrieve data request).

Having determined the DSN address, the DST client module 108 identifies a storage type associated with the data access request. The storage type includes at least one of storing a large object, storing a small object, storing a frequently accessed object, storing and infrequently accessed object, storing a high prioritized object, and storing a low prioritized object. The identifying includes at least one of interpreting an indicator of the request, comparing a size of the received data for storage to a size threshold, and accessing a historical record for the data object that indicates frequency of access. For example, the DST client module 108 identifies the frequently accessed object storage type based on interpreting the historical record of frequency of access.

Having determined the storage type, the DST client module 108 determines ranked scoring information for one or more resource levels of the plurality of DST execution unit pools based on the storage type. The determining includes identifying the one or more resource levels based on a DSN configuration, and for each level, issuing a ranked scoring information request 102 to the decentralized agreement module 80, where the request includes one or more of identifiers of storage resources associated with the level, weights of the storage resources for the storage type, and the DSN address as the asset identifier. In response to the request, the DST client module 108 receives the ranked scoring information 104.

Each resource (e.g., memory device, storage unit, storage pool) has a weight value associated with each storage type. For example, memory device 1 of DST execution unit 1 of the DST execution unit pool 1 has a weight A associated with a small data object storage type, and a weight B associated with the frequently accessed data storage type, etc. through a weight Z for another data storage type. In an example of the determining the ranked scoring information, the DST client module 108 obtains ranked scoring information for the plurality of storage pools for the frequently accessed object storage type as a first resource level, obtains rank scoring information for the DST execution units of a highest ranked storage pool as a second resource level, and obtains ranked scoring information for memory devices of each DST execution unit associated with highest rankings as a third resource level.

For each of the one or more resource levels, the DST client module 108 selects a storage resource based on the ranked scoring information 104. For example, the DST client module 108 selects a storage pool associated with a highest score from the ranked scoring information 104 of storage pools, selects a threshold number of DST execution units of the selected storage pool based on highest scores of the DST execution units from the rank scoring information 104 of the DST execution units of the selected storage pool, and for each selected DST execution unit, selects a memory device of the plurality of memory devices based on the highest scores of the rank scoring information 104 of the memory devices for the selected DST execution units.

Having selected the storage resources, the DST client module 108 accesses the selected DST execution unit pool utilizing the selected storage resources for each of the one or more resource levels. For example, the DST client module 108 issues, via the network 24, access requests 107 to the selected resources and receives access responses 109.

FIGS. 11A-C are schematic block diagrams of an embodiment of examples of resource characteristics. The resources by resource level are a storage pool of a set of storage pools, a set of storage units of a plurality of sets of storage units of the storage pool, storage units of the set of storage units, and memory devices of the storage units. Each resource level may have its own characteristics. For example, for a memory device includes a processing speed while a storage unit includes a total input/output operations per second. Each resource of a resource level also may have a plurality of characteristics. For example, the characteristics of a resource include one or more of storage capacity, processing speed, access latency, throughput, volatility, accessibility, input/output operations per second, network bandwidth, and historical reliability.

FIG. 11A illustrates an example of memory device characteristics 110, which include memory identifier (ID) 111, a capacity field, a speed field and a reliability score field. The memory ID 111 is a unique identifier (e.g., coefficient "a") of a resource. The capacity is one of an available storage capacity and a total storage capacity of the memory device. The speed field indicates one of the processing speed or the memory bandwidth of the memory device. The reliability score is determined based on a number of factors including age of the memory device, number of operations of the memory device, and type (e.g., RAID, SSD, Flash, volatile, non-volatile, etc) of the memory device.

FIG. 11B illustrates an example of storage unit characteristics 112, which include storage unit identifier (ID) 113, a capacity field, a total input/output operations per second (IOPS) field and a reliability score field. The storage unit characteristics may also be determined set by set. For example, a first set of storage units have first characteristics and a second set of storage units have second characteristics. As an example of the storage unit characteristics, a first storage unit has a capacity of 1000 terabytes (TB), a total IOPS of 1750, and a reliability score of 64. These characteristics are used to determine a weighting score for the resource to be utilized with a distributed agreement protocol function. The weighting score is discussing in further detail with reference to FIGS. 12-14.

FIG. 11C illustrates an example of storage pool characteristics 114, which include storage pool (SP) identifier (ID) 115, a capacity field, an average latency field and a reliability score field. As an example of the storage pool characteristics, a storage pool 2 has a capacity of 505 zettabytes (ZB), an average latency of 2 seconds, and a reliability score or 65.

FIG. 12 is a schematic block diagram of an embodiment of a plurality of sets of distributed agreement protocol (DAP) configuration information 128 that includes a resource identifier (ID) 123, data type field 124 and a weighting coefficient 126. The resource ID is a unique identifier of a resource (e.g., a memory device, a storage unit, a set of storage units, and a storage pool). The data type indicates a type of data assigned to a data segment or a data object.

A plurality of sets of DAP configuration information A-Z is generated for the plurality of resources for each resource level. For example, a first set of DAP configuration information 1-A through P-A is generated for data type A, a second set of DAP configuration information 1-B through P-B is generated for data type B, etc. In an example of the first set of DAP configuration information, a first portion of DAP configuration information 1-A corresponds to a first resource level (e.g., memory device), a second portion of DAP configuration information 2-A corresponds to a second resource level (e.g., storage unit), a third portion of DAP configuration information 3-A corresponds to a third resource level (e.g., set of storage units), and a fourth portion of DAP configuration information P-A corresponds to a fourth resource level (e.g., storage pool).

As illustrated, DAP configuration information 1-A corresponds to data type A, which has been assigned to large data objects (e.g., over a size threshold, e.g., over 6 GB, etc.). DAP configuration information 1-B corresponds to data type B, which has been assigned to frequently accessed data objects (e.g., based on an estimated access frequency, based on a historical analysis of access of the data object, etc.). This continues up to DAP configuration information 1-Z, which corresponds to data type Z, which has been assigned to high priority data objects (e.g., based on an identifier, based on an encryption type, etc.). This also continues for each resource level 1-P. For example, resource level P includes DAP configuration information P-A 128 which corresponds to data type A for resource level P, DAP configuration information P-B 128 which corresponds to data type B for resource level P, up to DAP configuration information P-Z 128 which corresponds to data type Z for resource level P.

The data type may include a variety of different data types. For example, a data type C is assigned to data that is both a large data object and a frequently accessed data object. As another example, data type D is assigned to data that is both a large data object and a high priority data object. As a non-exhaustive list, the data types include one or more of a size of the data object (e.g., small, medium, large), a level of access frequency (e.g., low, moderate, high), a level of priority, a level of security, a type of encryption, a type of encoding, and a data format.

The DAP configuration information also includes a weighting coefficient for each resource of each resource level. The weighting coefficient biases a distributed agreement protocol to store a data segment of data in one of a plurality of memory types of a DSN memory. In an embodiment, the weighting coefficient determines the likelihood a particular type of data will be stored in a particular type of memory device.

FIG. 13 is a flowchart illustrating an embodiment of an example of selecting storage resources. The method continues at step 130 where a processing module (e.g., of a distributed storage and task (DST) client module) determines to perform data access in a dispersed storage network (DSN) memory. The determining includes at least one of receiving a request, determining to retrieve data, and determining to store data.

The method continues at step 132 where the processing module determines a DSN address associated with the data access. For example, the processing module performs a DSN directory lookup using a data name of the data of the data access. The method continues at step 134 where the processing module identifies a storage type associated with the data access. The identifying includes at least one of interpreting an indicator of the request, comparing a size of the received data for storage to a size threshold, and accessing a historical record for the data indicating frequency of access.

The method continues at step 136 where the processing module determines ranked scoring information for one or more resource levels of the DSN memory. The determining includes identifying one or more resource levels based on configuration information of the DSN memory, performing a decentralized agreement function on one or more of the DSN address as an asset identifier, identifiers of storage resources of the one or more resource levels, and weights of each storage resource based on the storage type.

For each of the one or more resource levels, the method continues at step 138 where the processing module selects storage resources based on the ranked scoring information. For example, the processing module identifies storage resources associated with a highest score versus peer resources of a common resource level. For example, by a storage pool, by storage units, and by memory devices.

The method continues at step 140 where the processing module accesses the DSN memory utilizing the selected storage resource for each of the one or more resource levels. For example, the processing module accesses selected memory devices of selected storage units of a selected storage pool.

FIG. 14 is a flowchart illustrating an embodiment of an example of a method of generating DAP configuration information to utilize in selecting storage units of a dispersed storage network (DSN). The method begins or continues at step 142, where a computing device of the DSN identifying characteristics of a plurality of resources of a resource level the DSN. The DSN includes a plurality of resource levels that include the resource level. In this example, a data segment of a data object is one of a plurality of data types and is stored in memory of the DSN as a set of encoded data slices in accordance with a distributed agreement protocol (DAP). The characteristics may change from time to time. For example, a change occurs when a storage device is added, modified or deleted from the DSN memory. This change can initiate an updating process to produce updated characteristics of the plurality of resources of each resource level the DSN memory.

The characteristics include one or more of storage capacity, processing speed, access latency, throughput, volatility (e.g., volatile, non-volatile), accessibility, input/output operations per second, network bandwidth, and historical reliability. In an example, the resource level includes one of a storage pool within a plurality of storage pools, a set of storage units of a plurality of sets of storage units within the storage pool, a storage unit within the set of storage units, and a plurality of memory devices within the storage unit.

Having identified the characteristics of a plurality of resources for each resource level, the method continues at step 144, where the computing device generates a plurality of sets of DAP configuration information for the plurality of resources of each resource level based on the characteristics of the plurality of resources of each resource level and in accordance with the distributed agreement protocol. In an example, a first set of DAP configuration information includes a first set of a plurality of weighted coefficients for the plurality of resources of each resource level, a first type of data indicator, and a unique identifier for each resource of the plurality of resources of each resource level.

The method continues with step 146, where the computing device receives a data access request regarding a data segment of data from a requesting device. The method continues with step 148, where the computing device determines a data type of the data segment. In one embodiment, the data type includes one or more of a frequency of access of the data segment, a size of the data segment, a format of the data segment, a priority level of the data segment and a security level of the data segment. The computing device determines the type of data by one or more of determining an indicator included in the identifier indicates the data type, estimating a frequency of access based on date of creation and format of the data segment, determining the security level based on encoding and encryption parameters (e.g., higher security level for more secure encryption (e.g., key with 512 bits)), comparing a size of the data segment to a data size threshold, and accessing a historical record for a frequency of access regarding the data segment.

When the data type is the first data type of the plurality of data types, the method continues with step 150, where the computing device obtains the first set of DAP configuration information.

The method continues with step 152, where the computing device performs one or more distributed agreement protocol functions utilizing an identifier of the data and the first set of DAP configuration information to select storage units of the DSN. Alternatively, when the data type is a second data type, step 150 includes obtaining a second set of DAP configuration information of the plurality of sets of DAP configuration information and step 152 includes performing a distributed agreement protocol function utilizing the identifier of the data and the second set of DAP configuration information to select the storage units of the DSN. The identifier includes one or more of a source name, a slice name, a data name and a DSN address.

In one example, the computing device performs a first distributed agreement protocol function utilizing storage pool identifiers and to select a storage pool of a plurality of storage pools of the DSN memory, performs a second distributed agreement protocol function to select a set of storage units of a plurality of storage units of the selected storage pool of the DSN memory, performs a third distributed agreement protocol function to select storage units of the selected set of storage units of the DSN memory and performs a fourth distributed agreement protocol function to select a memory device of a storage unit of the selected storage units of the DSN memory.

The method continues with step 154 where the computing device sends the data access request to the selected storage units for execution. In one embodiment, the method continues by the computing device receiving a data access response from at least some of the selected storage units and sending the received data access responses to the requesting device.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data'). In addition, the terms "slice" and "encoded data slice" are used interchangeably.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a computing device of a storage network, the method comprising:
    detecting a storage error associated with a first memory device of a storage unit of a set of storage units of the storage network, wherein data is error encoded into a set of encoded data slices and stored in a plurality of memory devices of the set of storage units, and wherein the plurality of memory devices includes the first memory device;
    determining memory device attributes associated with the first memory device;
    determining memory device attributes of other memory devices of the plurality of memory devices;
    selecting a memory device from the other memory devices based on the memory device attributes of the memory device comparing favorably to the memory device attributes associated with the first memory device;
    rebuilding an encoded data slice associated with the storage error to produce a rebuilt encoded data slice; and
    storing the rebuilt encoded data slice in the selected memory device.

2. The method of claim 1, wherein the detecting the storage error comprises:
    interpreting an error message.

3. The method of claim 1, wherein the detecting the storage error comprises:
    interpreting a request.

4. The method of claim 1, wherein the detecting the storage error comprises:
    detecting a failed memory device.

5. The method of claim 1, wherein the detecting the storage error comprises:
    interpreting a memory test result.

6. The method of claim 1, wherein the detecting the storage error comprises:
    detecting a missing encoded data slice.

7. The method of claim 1, wherein the determining attributes associated with the first memory device comprises:
    interpreting a system registry.

8. The method of claim 1, wherein the determining attributes associated with the other memory devices comprises:
    interpreting a system registry.

9. The method of claim 1, wherein the determining attributes associated with the first memory device comprises:
    interpreting a memory device list.

10. The method of claim 1, wherein the determining attributes associated with the other memory devices comprises:
    interpreting a memory device list.

11. The method of claim 1, wherein the attributes of the memory device comparing favorably to the attributes associated with the first memory device comprises:
    determining the attributes of the memory device include a substantially similar available capacity level as the attributes associated with the first memory device.

12. The method of claim 1, wherein the attributes of the memory device comparing favorably to the attributes associated with the first memory device comprises:
    determining the attributes of the memory device include a substantially similar end-of-life timeframe as the attributes associated with the first memory device.

13. The method of claim 1, wherein the attributes of the memory device comparing favorably to the attributes associated with the first memory device comprises:
    determining the attributes of the memory device include a same serial number range as the attributes associated with the first memory device.

14. The method of claim 1, wherein the attributes of the memory device comparing favorably to the attributes associated with the first memory device comprises:
    determining the attributes of the memory device include a substantially similar performance level as the attributes associated with the first memory device.

15. The method of claim 1, wherein the attributes of the memory device comparing favorably to the attributes associated with the first memory device comprises:
    determining the attributes of the memory device include a same manufacture as the attributes associated with the first memory device.

16. The method of claim 1, wherein the rebuilding the encoded data slice comprises:
    obtaining a decode threshold number of encoded data slices of the set of encoded data slices;
    decoding the decode threshold number of encoded data slices to produce recovered data; and
    error encoding that recovered data to produce the rebuilt encoded data slice.

17. The method of claim 1 further comprises:
    associating a slice name of the rebuilt encoded data slice with the selected memory device.

18. The method of claim 17, wherein the associating comprises:
    updating a directory to include the slice name associated with the selected memory device and to disassociated the slice name from the first memory device.

19. The method of claim 17, wherein the associating comprises:
    updating an index to include the slice name associated with the selected memory device and to disassociated the slice name from the first memory device.

20. The method of claim 1, wherein the plurality of memory devices include "m" types of memory devices, and wherein each storage unit of the set of storage unit includes a first type of memory device of the "m" types of memory devices, and a second type of memory device of the "m" types of memory devices.

* * * * *